US012593663B2

(12) United States Patent
Weng et al.

(10) Patent No.: US 12,593,663 B2
(45) Date of Patent: Mar. 31, 2026

(54) MANUFACTURING METHOD OF GATE STRUCTURE

(71) Applicant: UNITED MICROELECTRONICS CORP., Hsin-Chu City (TW)

(72) Inventors: Tzu-Feng Weng, Tainan City (TW); Chao-Sheng Cheng, Taichung City (TW); Chi-Cheng Huang, Kaohsiung City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 550 days.

(21) Appl. No.: 17/949,186

(22) Filed: Sep. 20, 2022

(65) Prior Publication Data

US 2024/0063052 A1 Feb. 22, 2024

(30) Foreign Application Priority Data

Aug. 22, 2022 (TW) .................................. 111131471

(51) Int. Cl.
| | |
|---|---|
| *H10D 64/01* | (2025.01) |
| *H01L 21/28* | (2025.01) |
| *H01L 21/762* | (2006.01) |
| *H10D 64/27* | (2025.01) |
| *H10D 84/01* | (2026.01) |
| *H10D 84/03* | (2025.01) |
| *H10D 84/83* | (2025.01) |
| *H10P 90/00* | (2026.01) |

(Continued)

(52) U.S. Cl.
CPC ... *H10P 90/1906* (2026.01); *H10D 64/01334* (2026.01); *H10D 64/017* (2025.01); *H10W 10/061* (2026.01); *H10W 10/181* (2026.01)

(58) Field of Classification Search
CPC ......... H01L 21/76264; H01L 21/28141; H01L 21/28123; H01L 21/76224; H10D 64/017; H10D 64/518; H10D 84/83; H10D 84/0144; H10D 84/0151; H10D 84/014; H10D 84/038
See application file for complete search history.

(56) References Cited

U.S. PATENT DOCUMENTS

| | | | | |
|---|---|---|---|---|
| 9,633,857 B1* | 4/2017 | Smith | ................. | H10D 62/115 |
| 2006/0292795 A1* | 12/2006 | Kwon | ............... | H10D 30/0411 |
| | | | | 438/257 |

(Continued)

*Primary Examiner* — Christine S. Kim
*Assistant Examiner* — Sesha Sairaman Srinivasan
(74) *Attorney, Agent, or Firm* — Winston Hsu

(57) ABSTRACT

A manufacturing method of a gate structure includes the following steps. A semiconductor substrate is provided. An isolation structure is formed in the semiconductor substrate and surrounds an active region in the semiconductor substrate. A gate pattern is formed on the active region and the isolation structure. The gate pattern includes a first gate structure and a first capping layer disposed on the first gate structure. A part of the first capping layer located above an interface between the active region and the isolation structure is removed for exposing a part of the first gate structure located above the interface between the active region and the isolation structure. A removing process is performed for reducing a thickness of the part of the first gate structure located above the interface between the active region and the isolation structure.

18 Claims, 7 Drawing Sheets

(51) Int. Cl.
  *H10W 10/00* (2026.01)
  *H10W 10/10* (2026.01)

(56) References Cited

U.S. PATENT DOCUMENTS

| 2013/0157452 | A1* | 6/2013 | Chen ........................ H10D 1/47 |
| | | | 438/585 |
| 2016/0284697 | A1* | 9/2016 | Yoon .................... H10D 84/038 |
| 2017/0373083 | A1* | 12/2017 | Shukuri ................. H10B 43/35 |
| 2019/0206672 | A1 | 7/2019 | Hsu |
| 2021/0125980 | A1* | 4/2021 | Lee .................... H10D 30/6211 |
| 2022/0037196 | A1* | 2/2022 | Ku ......................... H10D 30/62 |

* cited by examiner

MANUFACTURING METHOD OF GATE STRUCTURE

BACKGROUND OF THE INVENTION

1. Field of the Invention

The present invention relates to a manufacturing method of a gate structure, and more particularly, to a manufacturing method of a gate structure formed on an active region and an isolation structure.

2. Description of the Prior Art

In the integrated circuit, transistors may be different from one another in structure for different operation voltages. For example, the transistors for relatively low operation voltage may be applied in core devices, input/output (I/O) devices, and so on. The transistors capable of high voltage processing may be applied in high operation voltage environment such as CPU power supply, power management system, AC/DC converter, and power amplifier. However, in order to form transistors corresponding to different operation voltages on the same wafer or chip, the processes are often complicated and the manufacturing cost and/or the manufacturing yield will be influenced accordingly. Therefore, how to improve the related problems through the design of structure and/or the design of process is a continuous issue for those in the related fields.

SUMMARY OF THE INVENTION

A manufacturing method of a gate structure is provided in the present invention. A part of a capping layer located above an interface between an active region and an isolation structure is removed, the thickness of a gate structure located above the interface may be reduced by other process accordingly, and the purposes of manufacturing yield enhancement and/or process simplification may be achieved.

According to an embodiment of the present invention, a manufacturing method of a gate structure is provided. The manufacturing method includes the following steps. A semiconductor substrate is provided. An isolation structure is formed in the semiconductor substrate and surrounds an active region in the semiconductor substrate. A gate pattern is formed on the active region and the isolation structure, and the gate pattern includes a first gate structure and a first capping layer disposed on the first gate structure. A part of the first capping layer located above an interface between the active region and the isolation structure is removed for exposing a part of the first gate structure located above the interface between the active region and the isolation structure. A removing process is performed for reducing a thickness of the part of the first gate structure located above the interface between the active region and the isolation structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a manufacturing method of a gate structure according to a first embodiment of the present invention, wherein FIG. 1 is a top view schematic drawing, FIG. 2 is a cross-sectional diagram taken along a line A-A' in FIG. 1, FIG. 3 is a schematic drawing in a step subsequent to FIG. 1, FIG. 4 is a cross-sectional diagram taken along a line B-B' in FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

FIGS. 8-11 are schematic drawings illustrating a manufacturing method of a gate structure according to a second embodiment of the present invention, wherein FIG. 9 is a schematic drawing in a step subsequent to FIG. 8, FIG. 10 is a schematic drawing in a step subsequent to FIG. 9, and FIG. 11 is a schematic drawing of a region in a step subsequent to FIG. 10.

FIG. 12 and FIG. 13 are schematic drawings illustrating a manufacturing method of a gate structure according to a third embodiment of the present invention, wherein FIG. 13 is a cross-sectional diagram taken along a line C-C' in FIG. 12.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
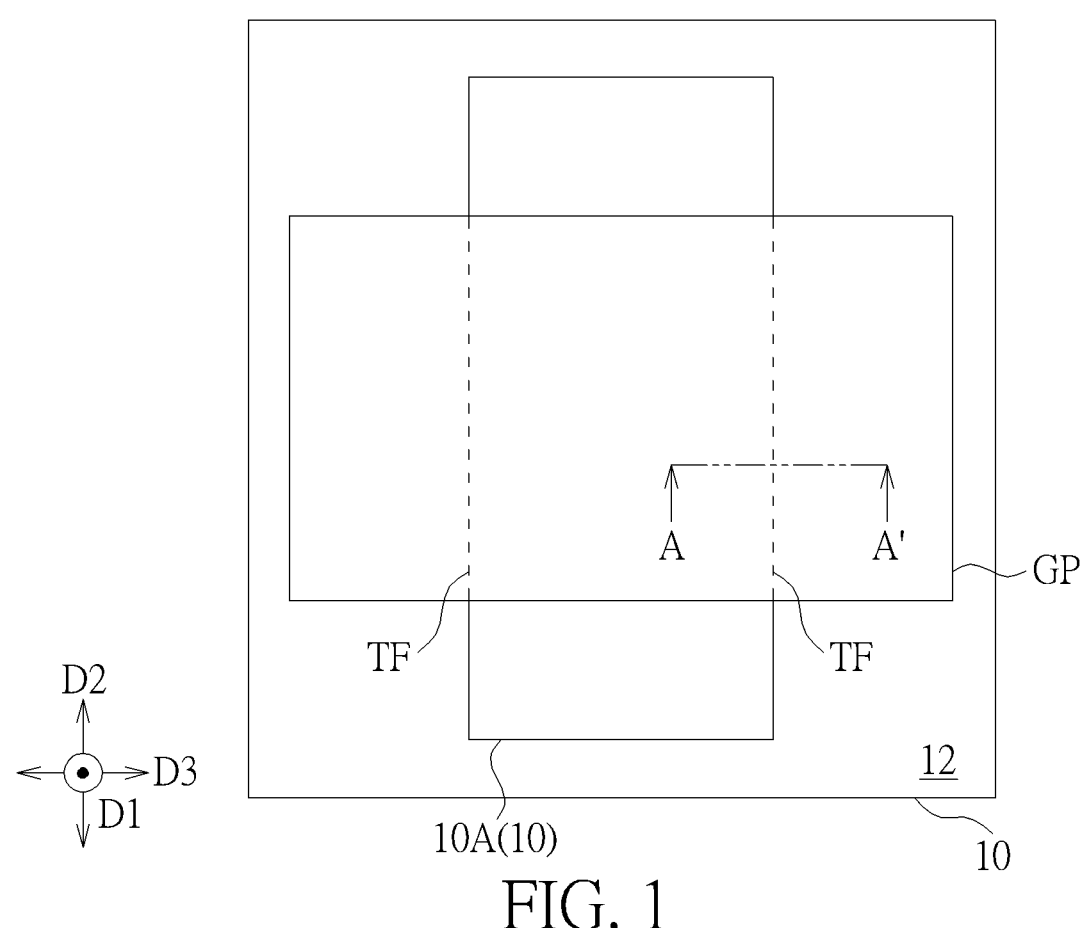
Figure 2:
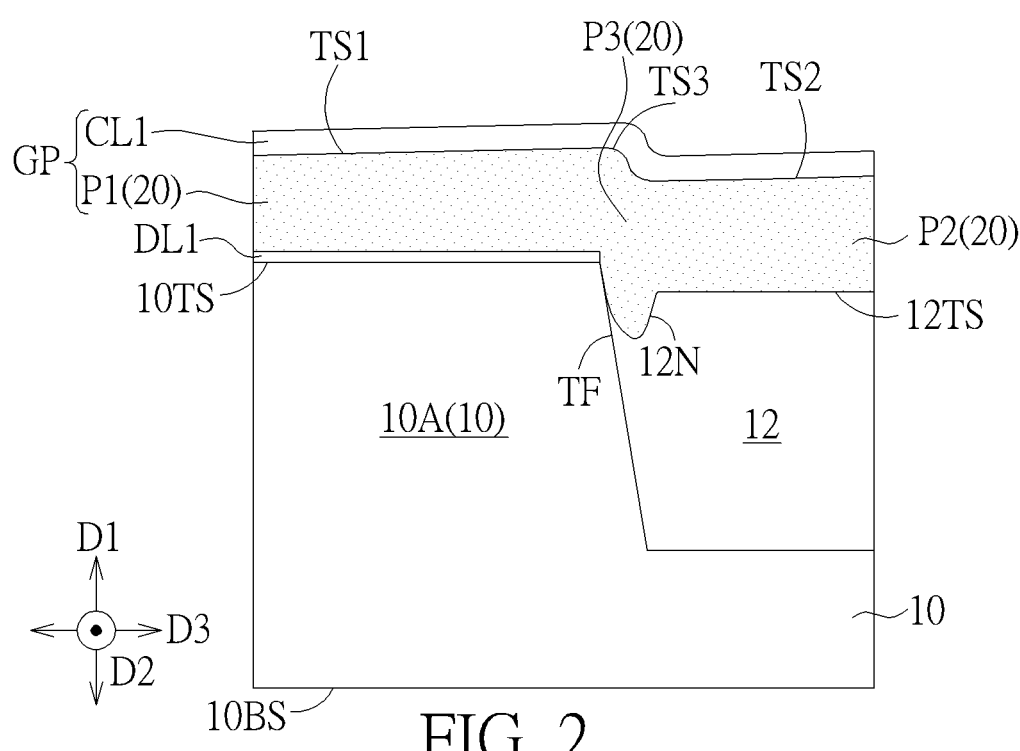
Figures 3, 4:
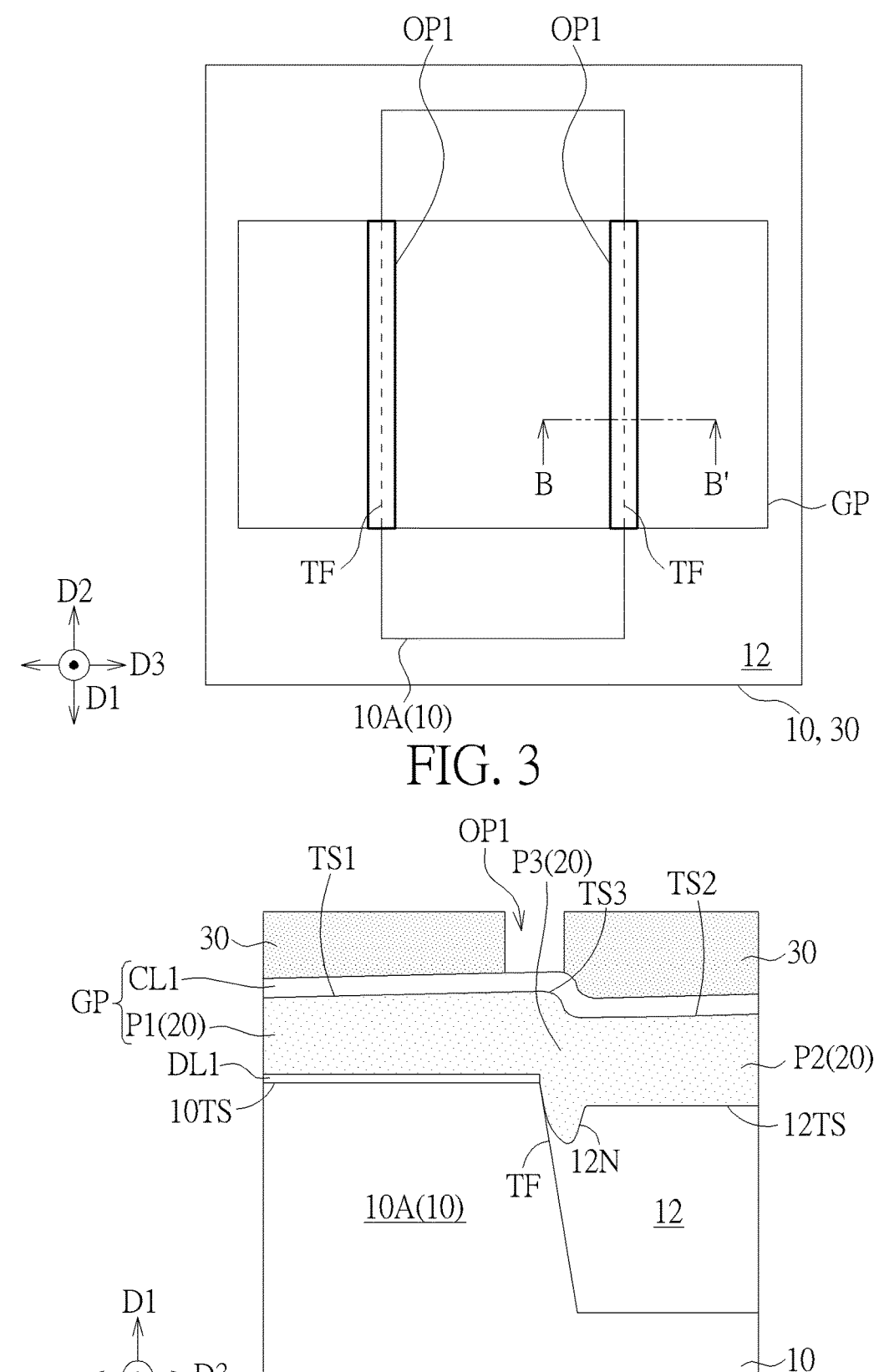
Figure 5:
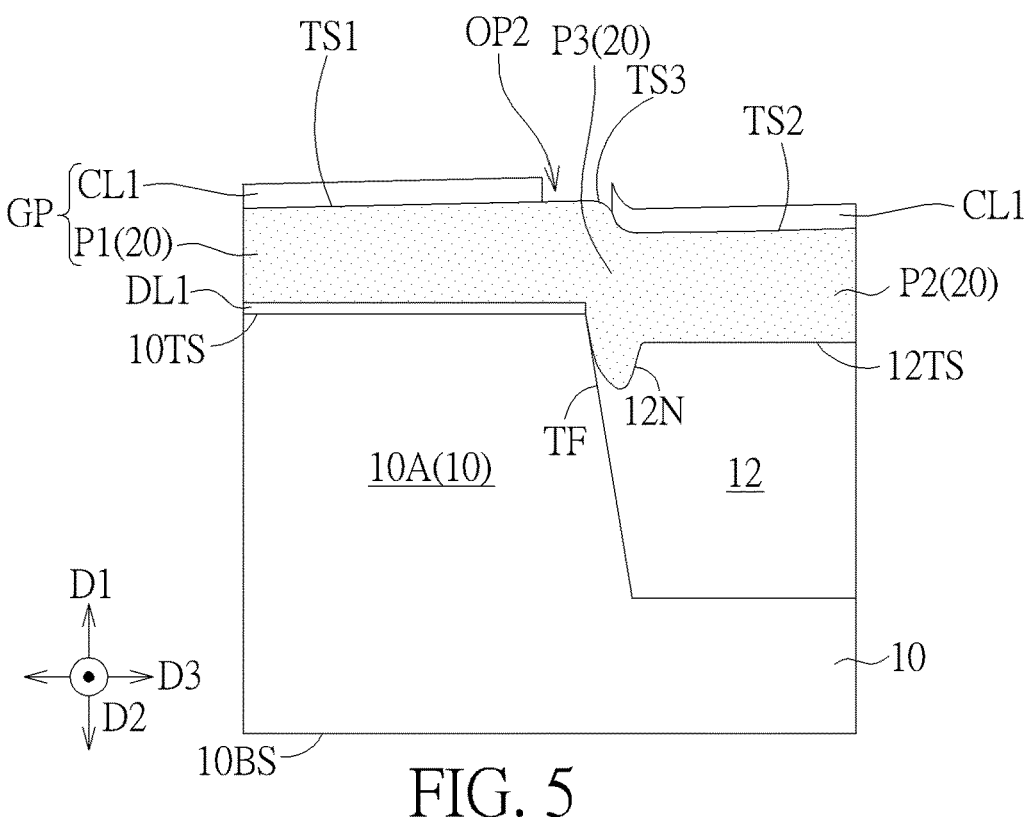
Figure 6:
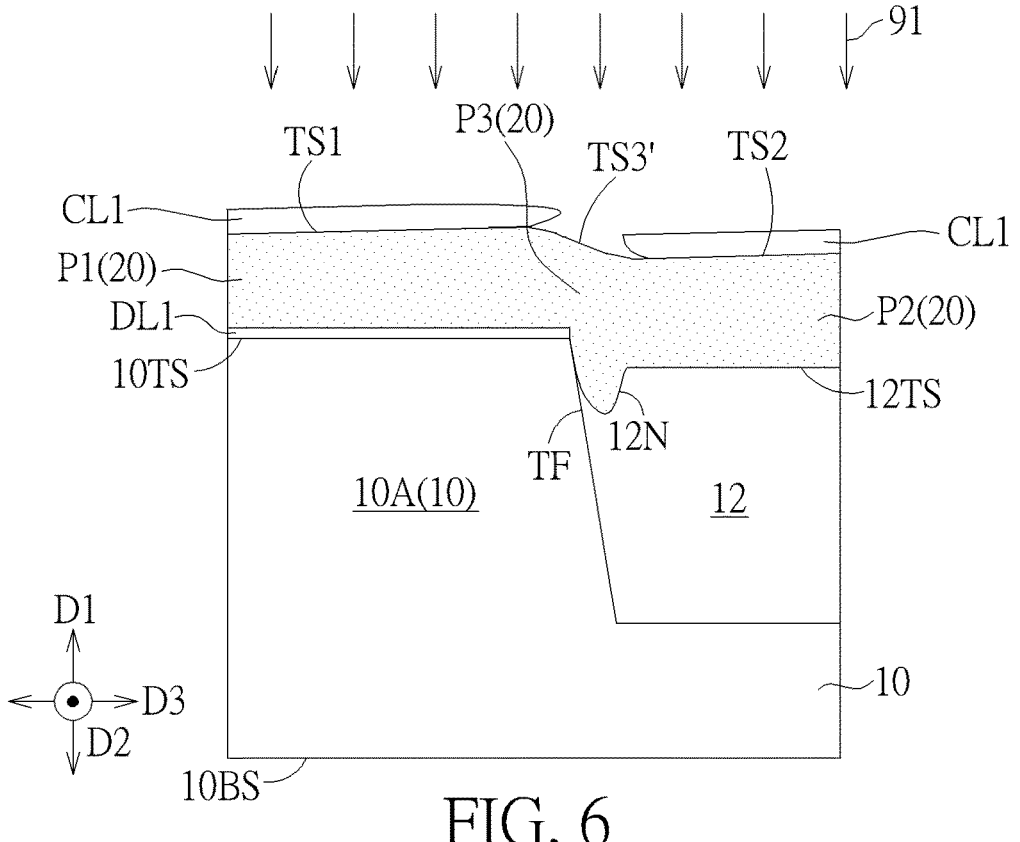
Figure 7:
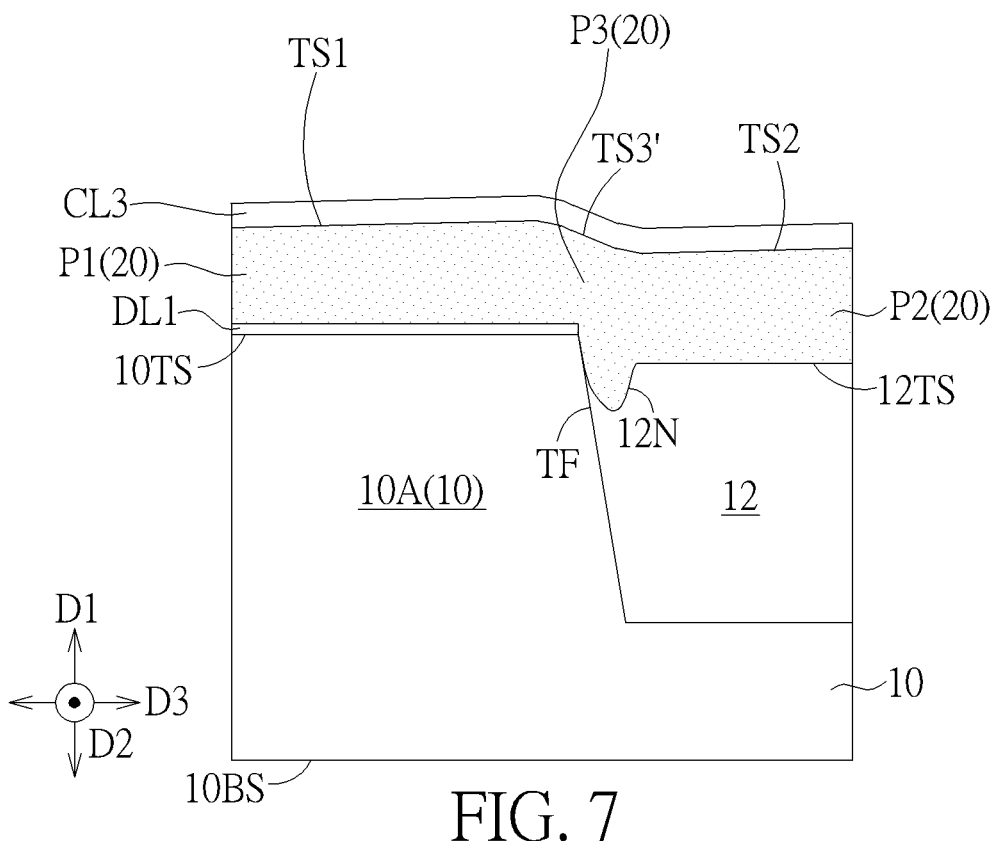

Please refer to FIGS. 1-7. FIGS. 1-7 are schematic drawings illustrating a manufacturing method of a gate structure according to a first embodiment of the present invention, wherein FIG. 1 is a top view schematic drawing, FIG. 2 is a cross-sectional diagram taken along a line A-A' in FIG. 1, FIG. 3 is a schematic drawing in a step subsequent to FIG. 1, FIG. 4 is a cross-sectional diagram taken along a line B-B' in FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6. The manufacturing method in this embodiment may include the following steps. Firstly, as shown in FIGS. 1-4, a semiconductor substrate 10 is provided. An isolation structure 12 is formed in the semiconductor substrate 10 and surrounds an active region 10A in the semiconductor substrate 10. Subsequently, a gate pattern GP is formed on the active region 10A and the isolation structure 12, and the gate pattern GP includes a first gate structure 20 and a first capping layer (such as a capping layer CL1 illustrated in FIG. 2) disposed on the first gate structure 20. As shown in FIG. 5, a part of the capping layer CL1 located above an interface TF between the active region 10A and the isolation structure 12 is removed for exposing a part of the first gate structure 20 located above the interface TF between the active region 10A and the isolation structure 12. As shown in FIG. 6, a removing process 91 is then performed for reducing a thickness of the part of the first gate structure 20 located above the interface TF between the active region 10A and the isolation structure 12. The thickness of the first gate structure 20 located above the interface TF may be reduced for reducing the surface height of this portion of the first gate structure 20. The negative impact of the too thick first gate structure 20 in subsequent processes, such as damages to and/or changes in condition of the first gate structure 20 in processes configured for other regions, may be avoided, and the manufacturing yield may be enhanced accordingly.

In some embodiments, a vertical direction (such as a direction D1 illustrated in FIGS. 1-6) may be regarded as a thickness direction of the semiconductor substrate 10, the semiconductor substrate 10 may have a top surface 10TS and a bottom surface 10BS opposite to the top surface 10TS in the direction D1, and the gate pattern GP described above may be formed on the top surface LOTS of the semiconductor substrate 10. Horizontal directions substantially orthogonal to the direction D1 (such as a direction D2 and a direction D3 illustrated in FIG. 1 and other directions orthogonal to the direction D1) may be substantially parallel with the top surface 10TS and/or the bottom surface 10BS of the semiconductor substrate 10, but not limited thereto. In this description, a distance between the bottom surface LOBS of the semiconductor substrate 10 and a relatively higher location and/or a relatively higher part in the vertical direction (such as the direction D1) may be greater than a distance between the bottom surface LOBS of the semiconductor substrate 10 and a relatively lower location and/or a relatively lower part in the direction D1. The bottom or a lower portion of each component may be closer to the bottom surface 10BS of the semiconductor substrate 10 in the direction D1 than the top or upper portion of this component. Another component disposed above a specific component may be regarded as being relatively far from the bottom surface 10BS of the semiconductor substrate 10 in the direction D1, and another component disposed under a specific component may be regarded as being relatively close to the bottom surface 10BS of the semiconductor substrate 10 in the direction D1.

Specifically, the manufacturing method in this embodiment may include but is not limited to the following steps. As shown in FIG. 1 and FIG. 2, the isolation structure 12 may be formed in the semiconductor substrate 10 for defining the active region 10A in the semiconductor substrate 10. In other words, the active region 10A may be a part of the semiconductor substrate 10, and the material composition of the active region 10A may be the same as the material composition of the semiconductor substrate 10. In some embodiments, the semiconductor substrate 10 may include a silicon substrate, an epitaxial silicon substrate, a silicon germanium substrate, a silicon carbide substrate, a silicon-on-insulator (SOI) substrate, or a semiconductor substrate made of other suitable semiconductor materials and/or made with other suitable structural designs. The isolation structure 12 may include a single layer or multiple layers of insulation materials, such as an insulation liner layer and an insulation gap-filling material, but not limited thereto. The insulation liner layer described above may include oxide insulation material or other suitable insulation materials, and the insulation gap-filling material described above may include a spin-on dielectric material, an insulation material formed by a deposition process (such as a chemical vapor deposition process), or a structure formed with other suitable manufacturing approaches and/or materials. In some embodiments, the isolation structure 12 may include a notch 12N located at an edge of the isolation structure 12 adjacent to the active region 10A, and a surface of the notch 12N is lower than a top surface 12TS of the isolation structure 12 in the direction D1. In some embodiments, the contact area between the first gate structure 20 and the active region 10A may be increased by the notch 12N, and the notch 12N may be formed by adjusting the material composition and/or the material distribution in the isolation structure 12 for being accompanied with the corresponding planarization process and/or the corresponding etching process, but not limited thereto.

After the step of forming the isolation structure 12, the gate pattern GP may be formed on the active region 10A and the isolation structure 12. In some embodiments, the active region 10A may be elongated in the direction D2, the gate pattern GP may be elongated in the direction D3 and may be formed straddling the active region 10A, and the direction D2 may be substantially orthogonal to the direction D3, but not limited thereto. The gate pattern GP includes the first gate structure 20 and the capping layer CL1, and the capping layer CL1 is disposed on the first gate structure 20 in the direction D1. In some embodiments, the first gate structure 20 and the capping layer CL1 may be formed concurrently by the same patterning process, and the projection pattern and the projection area of the capping layer CL1 in the direction D1 may be substantially the same as those of the first gate structure 20 in the direction D1, but not limited thereto. In addition, the first gate structure 20 may include electrically conductive non-metallic materials (such as an electrically conductive polycrystalline silicon material) or other suitable electrically conductive materials, and the capping layer CL1 may include an oxide insulation material (such as silicon oxide) or other suitable insulation materials. In some embodiments, a dielectric layer DL1 may be formed and located between the active region 10A and the gate pattern GP, and the dielectric layer DL1 may include oxide (such as silicon oxide) or other suitable dielectric materials.

In some embodiments, the notch 12N of the isolation structure 12 may be located adjacent to the interface TF between the active region 10A and the isolation structure 12, and the notch 12N is lower than the top surface 12TS of the isolation structure 12 in the direction D1. The top surface 12TS of the isolation structure 12 is lower than a top surface of the active region 10A (such as the top surface 10TS described above), and the gate pattern GP formed on the active region 10A and the isolation structure 12 will be influenced by the surface condition of the active region 10A, the isolation structure 12, and the interface TF.

For example, the first gate structure 20 may include a first portion P1, and second portion P2, and a third portion P3 connected with one another. The first portion P1 is located above the active region 10A in the direction D1, the second portion P2 is located above the isolation structure 12 in the direction D1, and the third portion P3 is located above the interface TF between the active region 10A and the isolation structure 12 in the direction D1. The third portion P3 may be located between the first portion P1 and the second portion P2, and the third portion P3 may be directly connected with the first portion P1 and the second portion P2. Because of the influence of the surface condition of the active region 10A, the isolation structure 12, and the interface TF, a top surface TS2 of the second portion P2 may be lower than a top surface TS1 of the first portion P1 in the direction D1, and a top surface TS3 of the third portion P3 may be higher than the top surface TS2 of the second portion P2 and the top surface TS1 of the first portion P1 in the direction D1, but not limited thereto. In addition, the capping layer CL1 may be formed conformally on the first gate structure 20 substantially, and the thickness of the capping layer CL1 located on the first portion P1, the thickness of the capping layer CL1 located on the second portion P2, and the thickness of the capping layer CL1 located on the third portion P3 may be substantially equal to one another, but not limited thereto.

As shown in FIGS. 3-5, a part of the capping layer CL1 located above the interface TF between the active region 10A and the isolation structure 12 may be removed for exposing a part of the first gate structure 20 located above the interface TF between the active region 10A and the isolation structure 12, such as the third portion described above. In this embodiment, the method for removing a part of the capping layer CL1 located above the interface TF between the active region 10A and the isolation structure 12 may include but is not limited to the following steps. As shown in FIG. 3 and FIG. 4, a patterned mask layer 30 may be formed on the capping layer CL1, the active region 10A, and the isolation structure 12, and an opening OP1 may penetrate through the patterned mask layer 30 in the direction D1 for exposing the capping layer CL1 located above the interface TF between the active region 10A and the isolation structure 12. In some embodiments, two openings OP1 may be formed and located at two opposite sides of the active region 10A in the direction D3, and each of the openings OP1 may be elongated in the direction D2, but not limited thereto. Subsequently, as shown in FIGS. 3-5, an etching process using the patterned mask layer 30 as an etching mask may be performed for forming an opening OP2 in the capping layer CL1, and the opening OP2 may penetrate through the capping layer CL1 in the direction D1 and expose the third portion P3 of the first gate structure 20. In other words, the opening OP2 may be regarded as an opening formed by transferring the pattern of the opening OP1 to the capping layer CL1 via the etching approach described above, the opening OP2 may be elongated in the direction D2 also, and the length of the opening OP2 in the direction D2 may be greater than the length of the opening OP2 in the direction D3 accordingly. Additionally, the patterned mask layer 30 may be removed after the opening OP2 is formed.

Subsequently, as shown in FIG. 5 and FIG. 6, the removing process 91 may be performed for removing a part of the third portion P3 of the first gate structure 20 exposed by the opening OP2 and reducing the thickness of the third portion P3. During the removing process 91, the first portion P1 and the second portion P2 of the first gate structure 20 may be covered by the capping layer CL1, and a part of the third portion P3 of the first gate structure 20 located adjacent to the top surface and exposed by the opening OP2 may be removed by the removing process 91 for lowering the top surface of the third portion P3. For instance, the top surface TS3 may become a top surface TS3' via the removing process 91. Therefore, after the removing process 91, the top surface TS3' of the third portion P3 may be lower than the top surface TS1 of the first portion P1 and higher than the top surface TS2 of the second portion P2 in the direction D1. Relatively, before the removing process 91, the top surface TS3 of the third portion P3 may be higher than the top surface TS1 of the first portion Pb and the top surface TS2 of the second portion P2 in the direction D1. It is worth noting that, in this description, the top surface of a specific component may include the topmost surface of this component in the direction D1, but not limited thereto. Additionally, the removing process 91 may include a planarization process, such as a chemical mechanical polishing (CMP) process, or other suitable removing approaches for controlling the removed part of the first gate structure 20 and avoiding excessive removal of the third portion P3 of the first gate structure 20 so that the top surface TS3' of the third portion P3 is too low.

As shown in FIG. 6 and FIG. 7, after the removing process 91, the capping layer CL1 may be removed, and another capping layer (such as a capping layer CL3) may then be formed on the first gate structure 20. In some embodiments, the capping layer CL3 may include an oxide insulation material (such as silicon oxide) or other suitable insulation materials, and the top surface of the first gate structure 20, such as the top surface TS1 of the first portion P1, the top surface TS2 of the second portion P2, and the top surface TS3' of the third portion P3, may be completely covered by the capping layer CL3. By reducing the thickness of the first gate structure 20 located above the interface TF between the active region 10A and the isolation structure 12 via the removing process 91, the protruding top surface (such as the top surface TS3 described above) of the first gate structure 20 may become a flatter top surface (such as the top surface TS3'), and the negative impact of the first gate structure 20 having the protruding surface in the subsequent processes, such as damages to and/or changes in condition of the first gate structure 20 in the processes configured for other regions, may be avoided, and the manufacturing yield may be enhanced accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
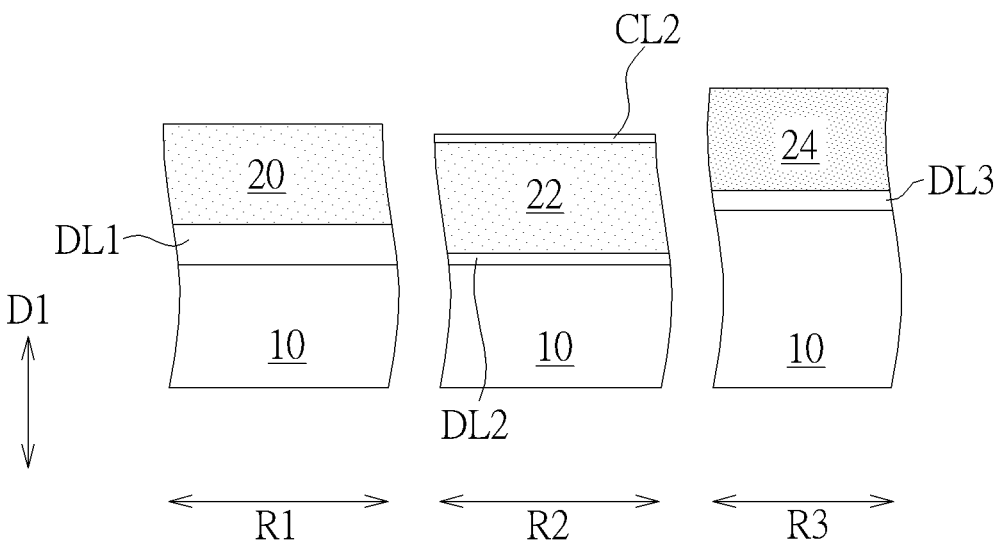
Figure 9:
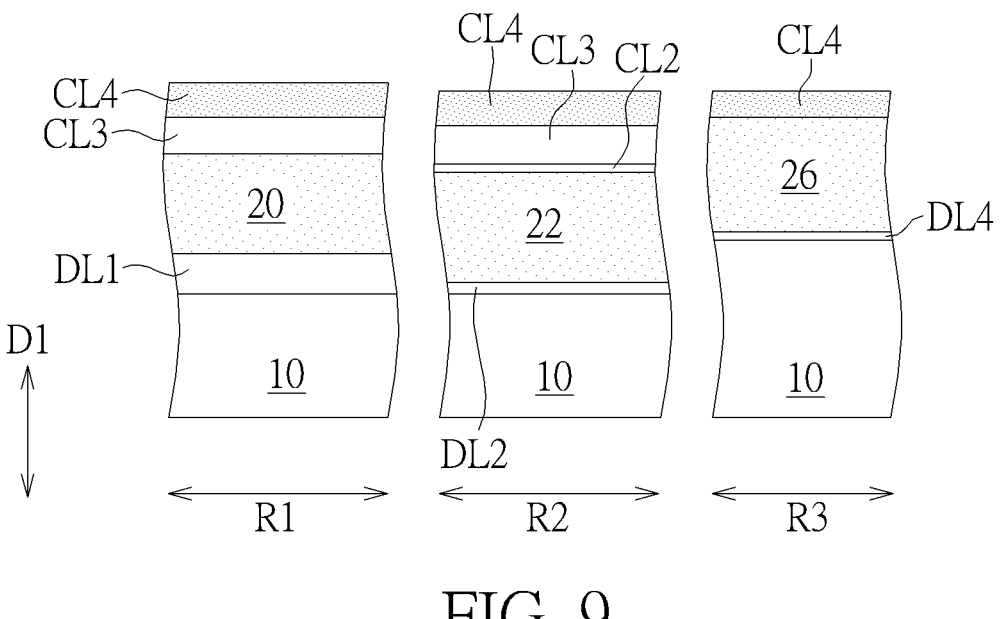
Figure 10:
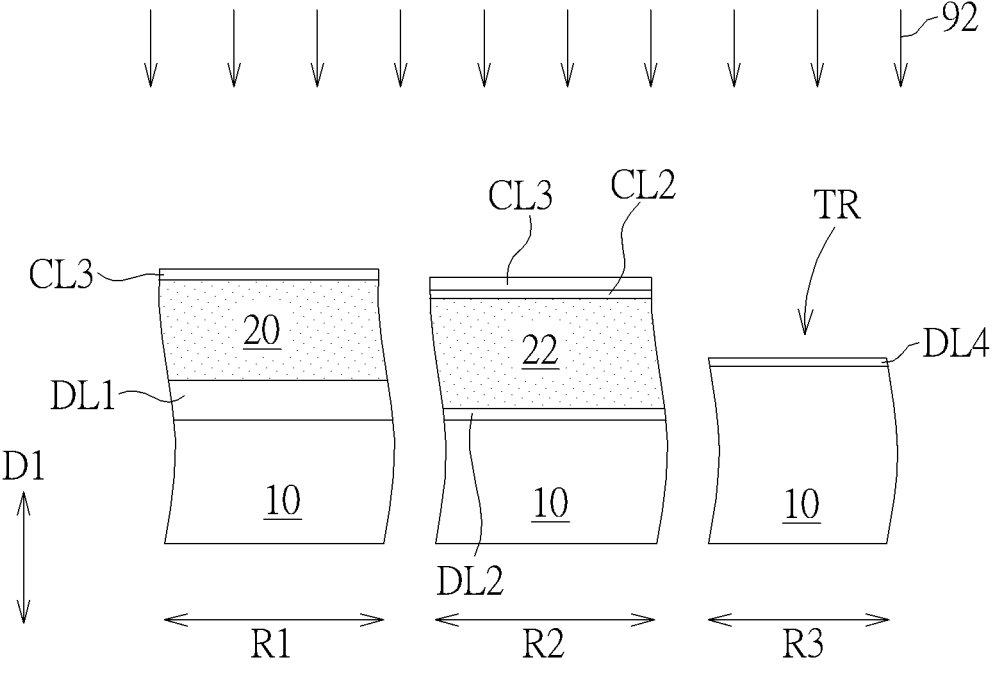
Figure 11:
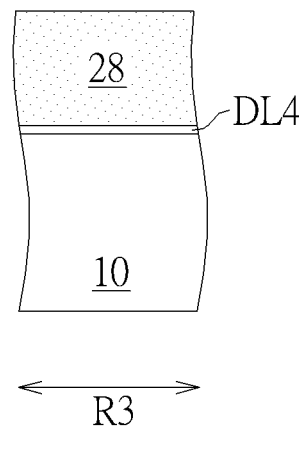

Please refer to FIGS. 8-11, and FIGS. 6-7. FIGS. 8-11 are schematic drawings illustrating a manufacturing method of a gate structure according to a second embodiment of the present invention, wherein FIG. 9 is a schematic drawing in a step subsequent to FIG. 8, FIG. 10 is a schematic drawing in a step subsequent to FIG. 9, and FIG. 11 is a schematic drawing of a region in a step subsequent to FIG. 10. In some embodiments, a portion of FIG. 8 may be regarded as a schematic drawing in a step subsequent to FIG. 6, and FIG. 7 may be regarded as a schematic drawing in a step subsequent to a portion of FIG. 8 and a schematic drawing in a step before a portion of FIG. 9, but not limited thereto. As shown in FIG. 6 and FIG. 8, in some embodiments, the first gate structure 20 described above may be formed above a first region R1 of the semiconductor substrate 10, and the manufacturing method may further include forming a second gate structure 22 above a second region R2 of the semiconductor substrate 10. The second gate structure 22 may include electrically conductive non-metallic materials (such as an electrically conductive polycrystalline silicon material) or other suitable electrically conductive materials. In some embodiments, the electrically conductive material for forming the second gate structure 22 may be formed on the second region R2 of the semiconductor substrate 10 before the removing process 91, and the removing process 91 may include a planarization process performed to this electrically conductive material (may be regarded as a planarization process performed to the second gate 22 structure also). A capping layer CL2 may be formed on the second gate structure 22 after the removing process 91, and the capping layer CL2 may include an oxide insulation material (such as silicon oxide) or other suitable insulation materials. In other words, the planarization process performed to the second gate structure 22 located on the second region R2 may be used to reducing the thickness of the third portion P3 of the first gate structure 20 located on the first region R1, and the purposes of process simplification and/or manufacturing cost reduction may be achieved accordingly.

In some embodiments, the first region R1 may include a high-voltage semiconductor device region, the second region R2 may include a memory cell region, the first gate structure 20 may be a gate electrode of a high-voltage semiconductor device, and the second gate structure 22 may be a word line in a memory cell, but not limited thereto. In some embodiments, the manufacturing method may further include forming a dielectric layer DL3 and a mask layer 24 on a third region R3 of the semiconductor substrate 10 and forming a dielectric layer DL2, and the dielectric layer DL2 is located between the second gate structure 22 and the semiconductor substrate 10. The dielectric layer DL2 and the dielectric layer DL3 may include oxide (such as silicon oxide) or other suitable dielectric materials, and the mask layer 24 may include nitride (such as silicon nitride) or other suitable dielectric materials. Subsequently, as shown in FIG. 6, FIG. 8, FIG. 7, and FIG. 9, after the removing process 91, the mask layer 24 and the dielectric layer DL3 may be removed, and a dielectric layer DL4 and a dummy gate structure 26 may be formed on the third region R3 of the semiconductor substrate 10. The dielectric layer DL4 may include oxide (such as silicon oxide) or other suitable dielectric materials, a thickness of the dielectric layer DL4 may be less than a thickness of the dielectric layer DL3, and the dummy gate structure 26 may include polycrystalline silicon or other suitable materials. After the step of forming the dummy gate structure 26, another capping layer CL4 may be formed. A portion of the capping layer CL4 may be formed on the capping layer CL3, and another portion of the capping layer CL4 may be formed on the dummy gate structure 26. The material composition of the capping layer CL4 may be different from the material composition of the capping layer CL3 for providing required etching selectivity in the subsequent processes. For instance, the capping layer CL4 may include nitride (such as silicon nitride) or other insulation materials different from the capping layer CL3.

Subsequently, as shown in FIGS. 9-11, a replacement metal gate process 92 may be performed for removing the dummy gate structure 26 and replacing the dummy gate structure 26 with a metal gate structure 28. In some embodiments, the metal gate structure 28 may include a work function layer (not illustrated) and a low electrical resistivity layer (not illustrated) disposed on the work function layer. The work function layer may include titanium nitride, titanium carbide, tantalum nitride, tantalum carbide, tungsten carbide, titanium tri-aluminide, aluminum titanium nitride, or other suitable electrically conductive work function materials, and the low electrical resistivity layer may include tungsten, aluminum, copper, titanium aluminide, titanium, or other suitable materials with low electrical resistivity. Additionally, in some embodiments, another dielectric layer (not illustrated), such as a high dielectric constant dielectric layer, may be formed and located between the metal gate structure 28 and the dielectric layer DL4, but not limited thereto. A gate trench TR may be formed by removing the dummy gate structure 26 via the replacement metal gate process 92, and the metal gate structure 28 may be formed in the gate trench TR, but not limited thereto. In some embodiments, the third region R3 may include a low-voltage semiconductor device region, a logic circuit region, or other regions different from the first region R1 and the second region R2, and the metal gate structure 28 may be a gate electrode in a low-voltage semiconductor device and/or a gate electrode in the logic circuit region, but not limited thereto.

As shown in FIGS. 9-11, the capping layer CL4 may be formed before the step of removing the dummy gate structure 26, and the capping layer CL4 located on the capping layer CL3 and the capping layer CL4 located on the dummy gate structure 26 may be removed before the step of removing the dummy gate structure 26. The method of removing the capping layer CL4 may include a chemical mechanical polishing process or other suitable removing approaches. By reducing the thickness of some area of the first gate structure 20 located on the first region R1 (such as reducing the thickness of the third portion P3 of the first gate structure 20 illustrated in FIG. 6), the first gate structure 20 with the protruding surface may be kept from being exposed in the chemical mechanical polishing process configured for removing the capping layer CL4, at least a portion of the first gate structure 20 may be kept from being replaced with a metal gate structure in the replacement metal gate process, and the purpose of manufacturing yield enhancement may be achieved accordingly. In other words, the top surface of the first gate structure 20 may be completely covered by the capping layer CL3 for being protected by the capping layer CL3 before the step of removing the dummy gate structure 26, during the step of removing the dummy gate structure 26, and after the step of removing the dummy gate structure 26. As shown in FIG. 7, the first gate structure 20 located above the active region 10A, the first gate structure 20 located above the isolation structure 12, and the first gate structure 20 located above the interface TF between the active region 10A and the isolation structure 12 may be covered by the capping layer CL3.

Figure 12:
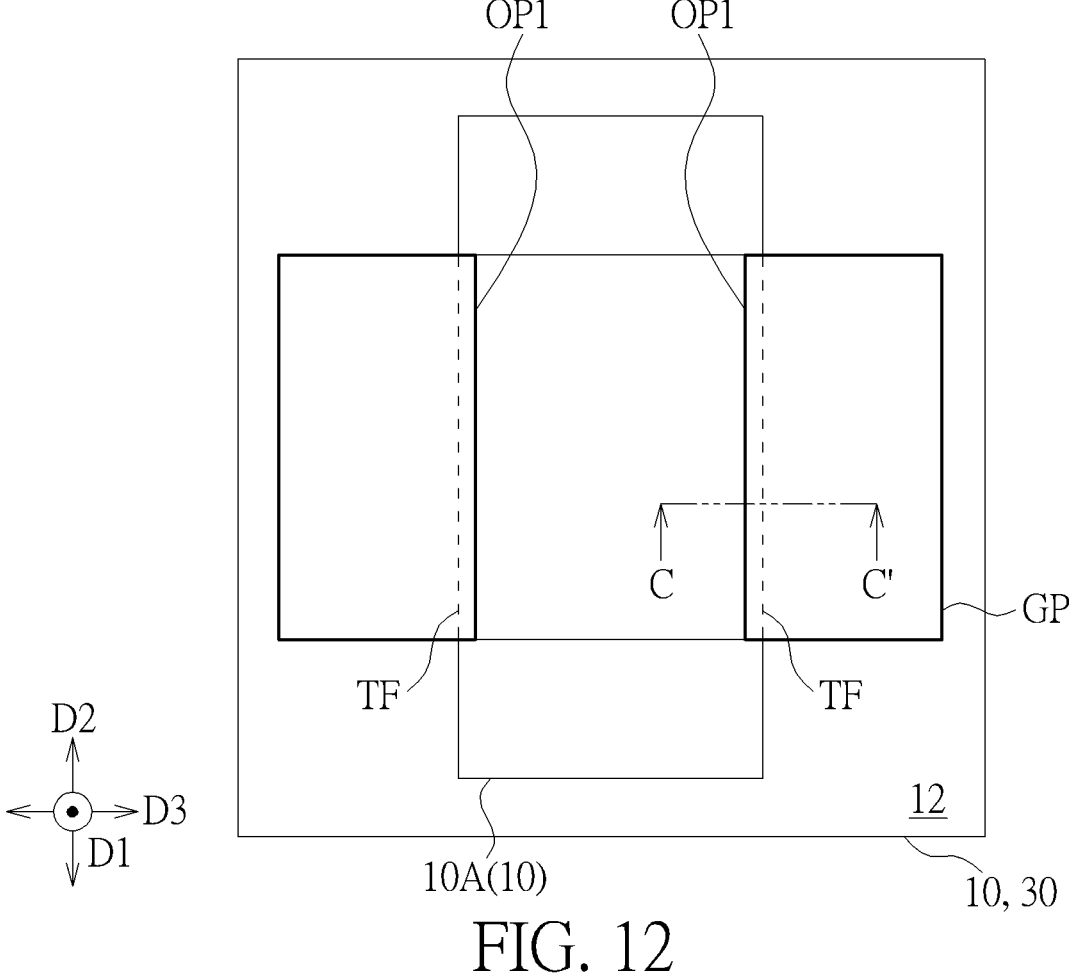
Figure 13:
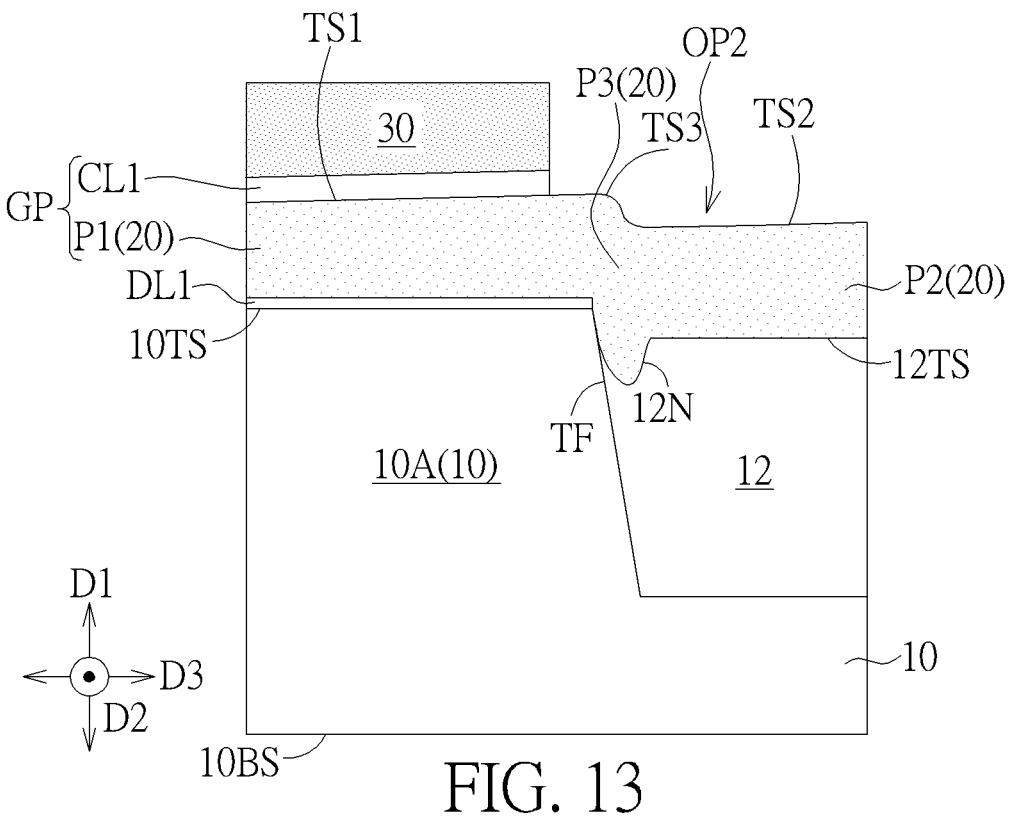

Please refer to FIG. 12 and FIG. 13. FIG. 12 and FIG. 13 are schematic drawings illustrating a manufacturing method of a gate structure according to a third embodiment of the present invention, wherein FIG. 13 is a cross-sectional diagram taken along a line C-C' in FIG. 12. As shown in FIG. 12 and FIG. 13, in some embodiments, the opening OP1 penetrating through the patterned mask layer 30 may further overlap the gate pattern GP located on the isolation structure 12 in the direction D1, and the opening OP2 formed corresponding to the opening OP1 may further expose the second portion P2 of the first gate structure 20 accordingly. The design of the opening OP2 in this embodiment may be used to ensure the thickness reduction of the third portion P3 of the first gate structure 20, and the condition where the opening OP2 is too small to reduce the thickness of the third portion P3 as desired may be avoided accordingly. In other words, the thickness reduction of the third portion P3 of the first gate structure 20 in the removing process described above may be controlled by adjusting the location and/or the dimension of the opening OP2.

Figure 14:
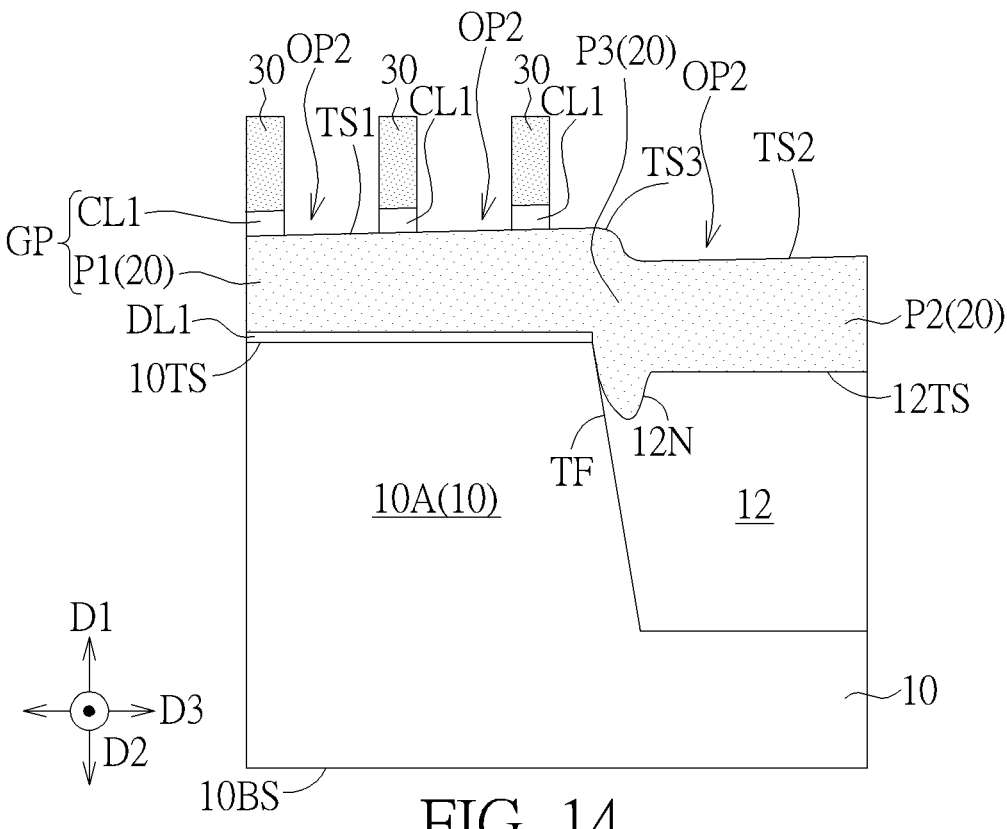
FIG. 14 is a schematic drawing illustrating a manufacturing method of a gate structure according to a fourth embodiment of the present invention.

Please refer to FIG. 14. FIG. 14 is a schematic drawing illustrating a manufacturing method of a gate structure according to a fourth embodiment of the present invention. As shown in FIG. 14, in some embodiments, the opening OP2 penetrating through the capping layer CL1 may expose the third portion P3 and the second portion P2 of the first gate structure 20, and the opening OP2 may further expose a part of the first portion P1 of the first gate structure 20. The design of the opening OP2 in this embodiment may be used to ensure the thickness reduction of the third portion P3 of the first gate structure 20, the thickness of the first portion P1 of the first gate structure 20 may also be reduced by the removing process described above because of the design of the opening OP2 in this embodiment, and the negative impact of the first gate structure 20 with the protruding surface on the subsequent processes may be further avoided accordingly.

To summarize the above descriptions, in the manufacturing method of the gate structure according to the present invention, a portion of the capping layer located above the interface between the active region and the isolation structure may be removed, and the thickness of the gate structure located above the interface may then be reduced in other process accordingly. The purposes of manufacturing yield enhancement and/or process simplification may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a gate structure, comprising:

providing a semiconductor substrate, wherein an isolation structure is formed in the semiconductor substrate and surrounds an active region in the semiconductor substrate;

forming a gate pattern on the active region and the isolation structure, wherein the gate pattern comprises:

a first gate structure; and a first capping layer disposed on the first gate structure;

performing a first removing process for removing a part of the first capping layer located above an interface between the active region and the isolation structure and exposing a part of the first gate structure located above the interface between the active region and the isolation structure;

performing a second removing process for reducing a thickness of the part of the first gate structure located above the interface between the active region and the isolation structure; and forming a second gate structure on the semiconductor substrate, wherein the second removing process comprises a planarization process performed to the second gate structure, and the thickness of the part of the first gate structure located above the interface between the active region and the isolation structure is reduced by the planarization process.

2. The manufacturing method of the gate structure according to claim 1, wherein the first gate structure comprises:

a first portion located above the active region in a vertical direction;

a second portion located above the isolation structure in the vertical direction; and a third portion located above the interface between the active region and the isolation structure, wherein the third portion is located between and directly connected with the first portion and the second portion.

3. The manufacturing method of the gate structure according to claim 2, wherein a top surface of the third portion is higher than a top surface of the second portion in the vertical direction before the second removing process.

4. The manufacturing method of the gate structure according to claim 2, wherein a top surface of the third portion is lower than a top surface of the first portion and higher than a top surface of the second portion after the second removing process.

5. The manufacturing method of the gate structure according to claim 2, wherein the first portion and the second portion are covered by the first capping layer during the second removing process.

6. The manufacturing method of the gate structure according to claim 2, wherein the first removing process comprises:

forming an opening penetrating through the first capping layer in the vertical direction and exposing the third portion of the first gate structure.

7. The manufacturing method of the gate structure according to claim 6, wherein the active region is elongated in a horizontal direction, and the opening is elongated in the horizontal direction.

8. The manufacturing method of the gate structure according to claim 6, wherein the opening further exposes the second portion of the first gate structure.

9. The manufacturing method of the gate structure according to claim 8, wherein the opening further exposes a part of the first portion of the first gate structure.

10. The manufacturing method of the gate structure according to claim 1, wherein the first gate structure is formed above a high-voltage semiconductor device region of the semiconductor substrate, and the second gate structure is formed above a memory cell region of the semiconductor substrate.

11. The manufacturing method of the gate structure according to claim 1, further comprising:

forming a dummy gate structure above a low-voltage semiconductor device region of the semiconductor substrate, wherein the first gate structure is formed above a high-voltage semiconductor device region of the semiconductor substrate; and performing a replacement metal gate process for removing the dummy gate structure and replacing the dummy gate structure with a metal gate structure.

12. The manufacturing method of the gate structure according to claim 11, wherein the first gate structure and the dummy gate structure comprise polycrystalline silicon.

13. The manufacturing method of the gate structure according to claim 11, further comprising:

removing the first capping layer after the second removing process; and forming a second capping layer on the first gate structure.

14. The manufacturing method of the gate structure according to claim 13, further comprising:

forming a third capping layer before the dummy gate structure is removed, wherein a portion of the third capping layer is formed on the second capping layer, and another portion of the third capping layer is formed on the dummy gate structure.

15. The manufacturing method of the gate structure according to claim 14, further comprising:

removing the third capping layer located on the second capping layer and the third capping layer located on the dummy gate structure before the dummy gate structure is removed.

16. The manufacturing method of the gate structure according to claim 15, wherein the first gate structure is covered by the second capping layer during the step of removing the dummy gate structure.

17. The manufacturing method of the gate structure according to claim 15, wherein the first gate structure located above the active region, the first gate structure located above the isolation structure, and the first gate structure located above the interface between the active region and the isolation structure are covered by the second capping layer before the step of removing the dummy gate structure and after the step of removing the dummy gate structure.

18. The manufacturing method of the gate structure according to claim 1, wherein a top surface of the isolation structure is lower than a top surface of the active region in a vertical direction.

\* \* \* \* \*